United States Patent
Tu et al.

(10) Patent No.: US 11,849,596 B2
(45) Date of Patent: Dec. 19, 2023

(54) PEROVSKITE SOLAR BATTERY AND PREPARATION METHOD THEREOF

(71) Applicant: CONTEMPORARY AMPEREX TECHNOLOGY CO., LIMITED, Ningde (CN)

(72) Inventors: Bao Tu, Ningde (CN); Weifeng Liang, Ningde (CN); Limei Zhou, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/355,095

(22) Filed: Jul. 19, 2023

(65) Prior Publication Data

US 2023/0363187 A1    Nov. 9, 2023

Related U.S. Application Data

(63) Continuation of application No. PCT/CN2022/079938, filed on Mar. 9, 2022.

(51) Int. Cl.
| | |
|---|---|
| *H10K 30/86* | (2023.01) |
| *H10K 30/50* | (2023.01) |
| *H10K 71/00* | (2023.01) |
| *H10K 30/85* | (2023.01) |
| *H10K 71/40* | (2023.01) |
| *H10K 30/88* | (2023.01) |
| *H10K 85/50* | (2023.01) |

(52) U.S. Cl.
CPC .............. *H10K 30/86* (2023.02); *H10K 30/50* (2023.02); *H10K 30/85* (2023.02); *H10K 71/40* (2023.02); *H10K 71/811* (2023.02); *H10K 30/88* (2023.02); *H10K 85/50* (2023.02)

(58) Field of Classification Search
None
See application file for complete search history.

(56) References Cited

FOREIGN PATENT DOCUMENTS

| CN | 109873078 A | 6/2019 |
|---|---|---|
| CN | 112864327 A | 5/2021 |

(Continued)

OTHER PUBLICATIONS

Elseman et al., Dalton Trans., 2020, 49, 14243-14250. (Year: 2020).*

(Continued)

*Primary Examiner* — Eli S Mekhlin
(74) *Attorney, Agent, or Firm* — Ladas & Parry LLP

(57) ABSTRACT

A perovskite solar battery, including a transparent conductive glass substrate, a hole transport layer, a perovskite light-absorbing layer, an electron transport layer, and an electrode are described. The hole transport layer is a nickel oxide hole transport layer. Simple-substance nickel exists on a contact surface of the hole transport layer in contact with the perovskite light-absorbing layer. On the contact surface of the hole transport layer in contact with the perovskite light-absorbing layer, a ratio between simple-substance nickel and trivalent nickel is 85:15 to 99:1, optionally 90:10 to 99:1, and further optionally 95:5 to 99:1. This application further provides a method for preparing a perovskite solar battery.

13 Claims, 1 Drawing Sheet

(56) References Cited

FOREIGN PATENT DOCUMENTS

| | | |
|---|---|---|
| CN | 113903860 A | 1/2022 |
| JP | 2019114691 A | 7/2019 |
| WO | 2011007925 A1 | 1/2011 |

OTHER PUBLICATIONS

ISR for International Application PCT/CN2022/079938 dated Sep. 29, 2022.
Written Opinion for International Application PCT/CN2022/079938 dated Sep. 29, 2022.

* cited by examiner

PEROVSKITE SOLAR BATTERY AND PREPARATION METHOD THEREOF

This application is a continuation of International application PCT/CN2022/079938 filed on Mar. 9, 2022 which is incorporated herein by reference in its entirety.

TECHNICAL FIELD

This application relates to the technical field of solar batteries, and in particular, to a perovskite solar battery and a preparation method thereof.

BACKGROUND

With the rapid development of the field of new energy, solar batteries have been widely used in the fields of military, aerospace, industry, commerce, agriculture, and telecommunications. Perovskite solar batteries have gradually become a hot topic of research of a new generation solar batteries by virtue of advantages such as high optical-to-electrical conversion efficiency, a simple manufacturing process, a low production cost, and a low material cost.

Serving as the most commonly used inorganic hole transport layer material in inverted perovskite solar batteries, nickel oxide is a preferred candidate material for the industrialization of perovskite solar batteries. However, trivalent nickel existent on the surface of the nickel oxide hole transport layer may react with A-site cations in a perovskite precursor solution, thereby deteriorating the optical-to-electrical conversion efficiency of a perovskite solar battery. In addition, erosion of a perovskite light-absorbing layer by water and oxygen may impair the stability of the perovskite solar battery to some extent. Therefore, the performance of existing perovskite solar batteries still needs to be improved.

SUMMARY

This application is developed in view of the above problems. An objective of this application is to provide a perovskite solar battery characterized by high optical-to-electrical conversion efficiency, long-term stability of the battery in use, and more cost-effective and efficient preparation method of the battery.

To achieve the foregoing objective, this application provides a perovskite solar battery and a preparation method thereof.

A first aspect of this application provides a perovskite solar battery, including a transparent conductive glass substrate, a hole transport layer, a perovskite light-absorbing layer, an electron transport layer, and an electrode. The hole transport layer is a nickel oxide hole transport layer. Simple-substance nickel exists on a contact surface of the hole transport layer in contact with the perovskite light-absorbing layer. On the contact surface of the hole transport layer in contact with the perovskite light-absorbing layer, a ratio between simple-substance nickel and trivalent nickel is 85:15 to 99:1, optionally 90:10 to 99:1, and further optionally 95:5 to 99:1.

In this way, in this application, simple-substance nickel is introduced into the contact surface of the nickel oxide hole transport layer in contact with the perovskite light-absorbing layer, thereby reducing the reactions between the high-valent nickel in the nickel oxide hole transport layer and the A-site cations in the perovskite light-absorbing layer. This can increase the open-circuit voltage of the perovskite solar battery, and in turn, enhance the optical-to-electrical conversion efficiency of the perovskite solar battery. Moreover, this can further suppress the impact exerted by water and oxygen on the perovskite light-absorbing material, and in turn, enhance the long-term stability of the perovskite solar battery.

In any embodiment, no interface passivation material, and optionally, no p-type interface passivation material, exists on the contact surface of the hole transport layer in contact with the perovskite light-absorbing layer.

In any embodiment, the perovskite solar battery is an inverted perovskite solar battery.

A second aspect of this application further provides a method for preparing a perovskite solar battery, including the following steps:

S1: providing a transparent conductive glass substrate;

S2: preparing a hole transport layer on the transparent conductive glass substrate;

S3: placing, in an airtight device, the transparent conductive glass substrate on which the hole transport layer is prepared, and passing a carrier gas and a reductive gas into the airtight device to react;

S4: preparing a perovskite light-absorbing layer on the hole transport layer treated in step S3;

S5: preparing an electron transport layer on the perovskite light-absorbing layer; and S6: preparing an electrode on the electron transport layer to obtain a perovskite solar battery.

The perovskite solar battery includes a transparent conductive glass substrate, a hole transport layer, a perovskite light-absorbing layer, an electron transport layer, and an electrode. The hole transport layer is a nickel oxide hole transport layer. Simple-substance nickel exists on a contact surface of the hole transport layer in contact with the perovskite light-absorbing layer. On the contact surface of the hole transport layer in contact with the perovskite light-absorbing layer, a ratio between simple-substance nickel and trivalent nickel is 85:15 to 99:1, optionally 90:10 to 99:1, and further optionally 95:5 to 99:1.

In this way, the preparation method described in this application treats the surface of the nickel oxide hole transport layer by use of a reductive gas, and reduces the charged nickel oxide on the surface to nanometer simple-substance nickel particles, thereby helping to prevent perovskite decomposition caused by the reaction between the trivalent nickel and the perovskite, and in turn, improving the optical-to-electrical conversion efficiency and stability of the solar battery.

In any embodiment, in step S3, the reductive gas is at least one selected from hydrogen, carbon monoxide, hydrogen sulfide, sulfur dioxide, hydrogen iodide, or ammonia.

In any embodiment, in the step S3, the carrier gas is at least one selected from nitrogen or argon.

In any embodiment, in step S3, a ratio between the carrier gas and the reductive gas is 99:1 to 70:30.

In any embodiment, in step S3, a duration of the reaction is 10 to 60 minutes.

In any embodiment, in step S3, a temperature of the reaction is 150° C. to 250° C.

DETAILED DESCRIPTION

Figure 1:
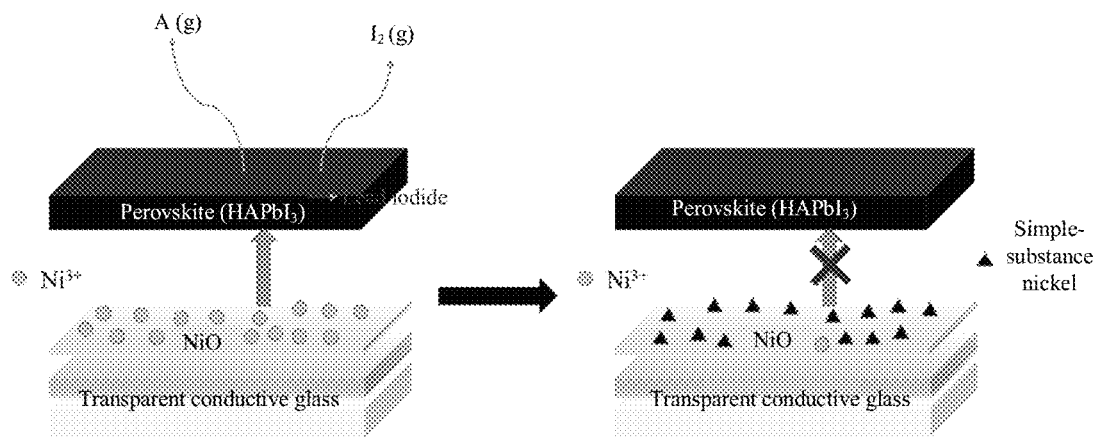
FIG. 1 is a schematic diagram of a perovskite solar battery before and after reduction of a nickel oxide hole transport layer of the perovskite solar battery according to an embodiment of this application.

The following describes and discloses in detail a perovskite solar battery and a preparation method thereof according to this application with due reference to drawings. However, unnecessary details may be omitted in some cases. For example, a detailed description of a well-known matter or repeated description of an essentially identical structure may be omitted. That is intended to prevent the following descriptions from becoming unnecessarily lengthy, and to facilitate understanding by a person skilled in the art. In addition, the drawings and the following descriptions are intended for a person skilled in the art to thoroughly understand this application, but not intended to limit the subject-matter set forth in the claims.

A "range" disclosed herein is defined in the form of a lower limit and an upper limit. A given range is defined by a lower limit and an upper limit selected. The selected lower and upper limits define the boundaries of a particular range. A range so defined may be inclusive or exclusive of the end values, and a lower limit of one range may be arbitrarily combined with an upper limit of another range to form a range. For example, if a given parameter falls within a range of 60 to 120 and a range of 80 to 110, it is expectable that the parameter may fall within a range of 60 to 110 and a range of 80 to 120 as well. In addition, if lower-limit values 1 and 2 are listed, and if upper-limit values 3, 4, and 5 are listed, the following ranges are all expectable: 1 to 3, 1 to 4, 1 to 5, 2 to 3, 2 to 4, and 2 to 5. Unless otherwise specified herein, a numerical range "a to b" is a brief representation of a combination of any real numbers between a and b inclusive, where both a and b are real numbers. For example, a numerical range "0 to 5" herein means all real numbers recited between 0 and 5 inclusive, and the expression "0 to 5" is just a brief representation of a combination of such numbers. In addition, a statement that a parameter is an integer greater than or equal to 2 is equivalent to a disclosure that the parameter is an integer such as 2, 3, 4, 5, 6, 7, 8, 9, 10, 11, 12, and so on.

Unless otherwise expressly specified herein, any embodiments and optional embodiments hereof may be combined with each other to form a new technical solution.

Unless otherwise expressly specified herein, any technical features and optional technical features hereof may be combined with each other to form a new technical solution.

Unless otherwise expressly specified herein, all steps described herein may be performed in sequence or at random, and preferably in sequence. For example, that the method includes steps (a) and (b) indicates that the method may include steps (a) and (b) performed in sequence, or steps (b) and (a) performed in sequence. For example, that the method may further include step (c) indicates that step (c) may be added into the method in any order. For example, the method may include steps (a), (b), and (c), or may include steps (a), (c), and (b), or may include steps (c), (a), and (b), and so on.

Unless otherwise expressly specified herein, "include" and "comprise" mentioned herein mean open-ended inclusion, or closed-ended inclusion. For example, the terms "include" and "comprise" may mean inclusion of other items that are not recited, or inclusion of only the items recited.

Unless otherwise expressly specified herein, the term "or" is inclusive. For example, the expression "A or B" means "A alone, B alone, or both A and B". More specifically, any one of the following conditions satisfies the condition "A or B": A is true (or existent) and B is false (or absent); A is false (or absent) and B is true (or existent); and, both A and B are true (or existent).

Serving as the most commonly used inorganic hole transport layer material in inverted perovskite solar batteries, nickel oxide is a preferred candidate material for the industrialization of perovskite solar batteries. However, trivalent nickel existent on the surface of the nickel oxide hole transport layer may react with A-site cations in a perovskite precursor solution. As a result, the A site becomes vacant, and excess lead halide remains at the interface, thereby increasing occurrences of charge recombination at the interface, and reducing the open-circuit voltage of the perovskite solar battery. In addition, erosion of a perovskite light-absorbing layer by water and oxygen may impair the stability of the device to some extent.

Based on a large number of experiments, the applicant of this application finds that when the charged nickel oxide on the surface is reduced to nanometer simple-substance nickel particles by treating the nickel oxide film surface by use of a reductive gas, the occurrences of charge recombination on the interface are reduced by virtue of a tunneling effect of the thin-layer metal nickel. At the same time, the impact exerted by water and oxygen on the perovskite light-absorbing layer is suppressed, and the stability is further improved on the basis of ensuring high performance.

According to an embodiment of this application, this application discloses a perovskite solar battery, including a transparent conductive glass substrate, a hole transport layer, a perovskite light-absorbing layer, an electron transport layer, and an electrode. The hole transport layer is a nickel oxide hole transport layer. Simple-substance nickel exists on a contact surface of the hole transport layer in contact with the perovskite light-absorbing layer. On the contact surface of the hole transport layer in contact with the perovskite light-absorbing layer, a ratio between simple-substance nickel and trivalent nickel is 85:15 to 99:1, optionally 90:10 to 99:1, and further optionally 95:5 to 99:1.

Although the underlying mechanism still remains unclear, the applicant hereof unexpectedly finds that, in this application, simple-substance nickel is introduced into the contact surface of the nickel oxide hole transport layer in contact with the perovskite light-absorbing layer, thereby reducing the reactions between the high-valent nickel in the nickel oxide hole transport layer and the A-site cations in the perovskite light-absorbing layer. Therefore, there is no lead halide residue at the interface between the nickel oxide hole transport layer and the perovskite light-absorbing layer, thereby reducing non-radiative recombination at the interface. This can increase the open-circuit voltage of the perovskite solar battery, and in turn, enhance the optical-to-electrical conversion efficiency of the perovskite solar battery. Moreover, the introduced simple-substance nickel can further suppress the impact exerted by water and oxygen on the perovskite light-absorbing material, and in turn, enhance the long-term stability of the perovskite solar battery.

As shown in FIG. 1, this application reduces the charged nickel, especially trivalent nickel ($Ni^{3+}$) on the surface of the hole transport layer to simple-substance nickel by means of in-situ reduction of the nickel oxide hole transport layer. In this way, the reactions between the trivalent nickel in the nickel oxide hole transport layer and the A-site cation (in this embodiment, HA, where HA is formamidine cation or methylamine cation) in the perovskite light-absorbing layer are reduced, thereby eliminating the lead halide (in this embodiment, lead iodide) residue at the interface between the nickel oxide hole transport layer and the perovskite light-absorbing layer, and in turn, improving the optical-to-electrical conversion efficiency of the perovskite solar battery.

In this embodiment of this application, the perovskite light-absorbing layer and the perovskite layer are used interchangeably.

In some embodiments, no trivalent nickel exists on the contact surface of the hole transport layer in contact with the perovskite light-absorbing layer.

In some embodiments, the hole transport layer is a nickel oxide hole transport layer.

Nickel oxide is a commonly used hole transport layer material of inverted perovskite solar batteries. Nickel oxide is generally expressed as $NiO_x$, representing one or more of nickel oxide, dinickel trioxide, or the like.

In some embodiments, NiO, $Ni(OH)_2$, $Ni_2O_3$, NiOOH, and other substances may exist in the hole transport layer.

In some embodiments, no interface passivation material, and optionally, no p-type interface passivation material, exists on the contact surface of the hole transport layer in contact with the perovskite light-absorbing layer. In other words, no passivation layer, that is, no passivation layer for passivating the hole transport layer, exists between the hole transport layer and the perovskite light-absorbing layer. Optionally, no other layers exist between the hole transport layer and the perovskite light-absorbing layer.

Even if no passivation layer exists between the hole transport layer and the perovskite light-absorbing layer, the performance and stability of the perovskite solar battery can still be ensured according to this application. Moreover, this application saves material cost, time cost, and environment cost, and is highly cost-efficient.

In some embodiments of this application, the thickness of the hole transport layer is 10 nm to 100 nm.

In some embodiments, the perovskite solar battery is an inverted perovskite solar battery.

In some embodiments, the transparent conductive glass substrate includes glass and a transparent conductive oxide. The transparent conductive oxide is selected from fluorine-doped tin oxide (FTO), indium tin oxide (ITO), aluminum-doped zinc oxide (AZO), boron-doped zinc oxide (BZO), indium zinc oxide (IZO), and the like. The thickness of glass is 0.1 to 3 cm. The thickness of transparent conductive oxide is 100 to 1000 nm.

Figure 2:
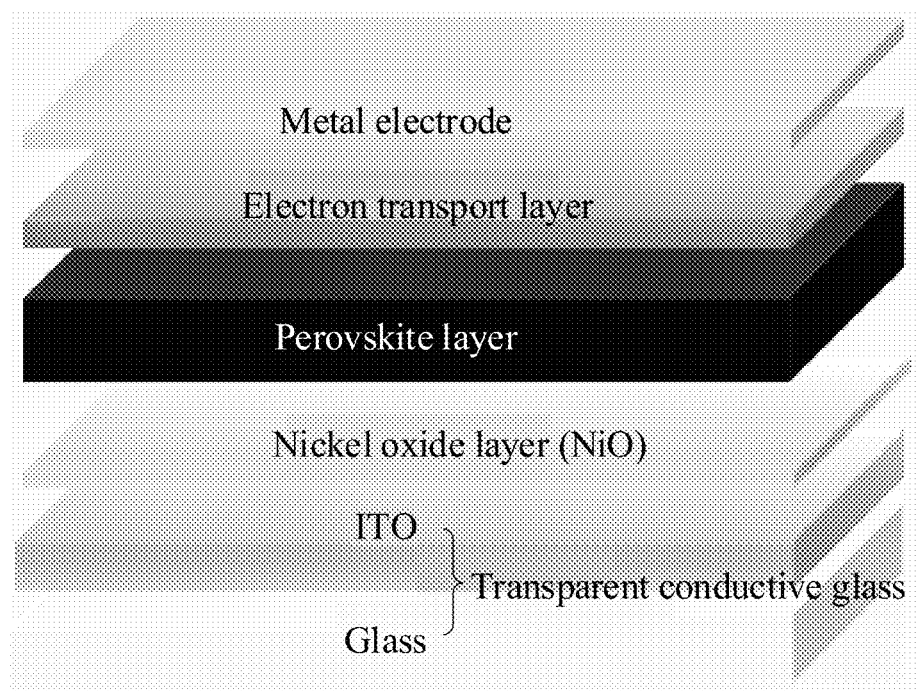
FIG. 2 is a schematic diagram of a perovskite solar battery according to an embodiment of this application.

As shown in FIG. 2, in an inverted perovskite solar battery, a transparent conductive glass substrate (in this embodiment, the transparent conductive oxide is ITO), a nickel oxide hole transport layer (that is, a nickel oxide layer), a perovskite light-absorbing layer, an electron transport layer, and an electrode (in this embodiment, a metal electrode) are arranged successively from bottom to top. Simple-substance nickel exists on the contact surface of the nickel oxide hole transport layer in contact with the perovskite light-absorbing layer.

In some embodiments, the chemical formula of the material of the perovskite light-absorbing layer is $ABX_3$ or $A_2CDX_6$, where A is an inorganic or organic or organic-inorganic hybrid cation, and optionally, is at least one of methylamino ($CH_3NH_3^+$) ($MA^+$), formamidino (HC$(NH_2)_2^+$) ($FA^+$), cesium ion ($Cs^+$), or rubidium ($Rb^+$). Further optionally, A is methylamino ($CH_3NH_3^+$) or formamidino ($HC(NH_2)_2^+$. B is an inorganic or organic or organic-inorganic hybrid cation, and optionally at least one of divalent metal ions $Pb_2^+$ or $Sn_2^+$. C is an inorganic or organic or organic-inorganic hybrid cation, and optionally a monovalent metal ion $Ag^+$ or the like. D is an inorganic or organic or organic-inorganic hybrid cation, and optionally trivalent metal ion bismuth cation $Bi_3^+$, antimony cation $Sb_3^+$, indium cation $In_3^+$, and the like. X is an inorganic or organic or organic-inorganic hybrid anion, and optionally one or more of halogen anion or carboxylate anion, and further optionally bromide ion ($Br^-$) or iodide ion ($I^-$).

In some embodiments, a band gap of the perovskite light-absorbing layer is 1.20 eV to 2.30 eV.

In some embodiments, a thickness of the perovskite light-absorbing layer is 200 nm to 1000 nm.

In some embodiments, the material of the electron transport layer is at least one of the following materials and a derivative thereof and a material obtained by doping or passivating the following materials: [6,6]-phenyl $C_{61}$-methyl butyrate ($PC_{61}BM$), [6,6]-phenyl-$C_{71}$-methyl butyrate ($PC_{71}BM$), fullerene $C_{60}$ ($C_{60}$), fullerene $C_{70}$ ($C_{70}$), tin dioxide ($SnO_2$), zinc oxide (ZnO), and the like.

In some embodiments, a thickness of the electron transport layer is 30 to 120 nm.

In some embodiments, the material of the electrode is an organic or inorganic or organic-inorganic hybrid conductive material, and optionally Ag, Cu, C, Au, Al, ITO, AZO, BZO, or IZO.

In some embodiments, a thickness of the electrode is 10 to 200 nm.

In some embodiments, a passivation layer may exist between the perovskite light-absorbing layer and the electron transport layer, and may be configured to passivate defects on an interface between the two layers.

In some embodiments, a passivation layer may exist between the electron transport layer and the electrode to improve the performance of the perovskite solar battery.

In an embodiment of this application, this application discloses a method for preparing a perovskite solar battery, including the following steps:

S1: providing a transparent conductive glass substrate;
S2: preparing a hole transport layer on the transparent conductive glass substrate;
S3: placing, in an airtight device, the transparent conductive glass substrate on which the hole transport layer is prepared, and passing a carrier gas and a reductive gas into the airtight device to react;
S4: preparing a perovskite light-absorbing layer on the hole transport layer treated in Step 3;
S5: preparing an electron transport layer on the perovskite light-absorbing layer; and
S6: preparing an electrode on the electron transport layer to obtain a perovskite solar battery.

The perovskite solar battery includes a transparent conductive glass substrate, a hole transport layer, a perovskite light-absorbing layer, an electron transport layer, and an electrode. The hole transport layer is a nickel oxide hole transport layer. Simple-substance nickel exists on a contact surface of the hole transport layer in contact with the perovskite light-absorbing layer. On the contact surface of the hole transport layer in contact with the perovskite light-absorbing layer, a ratio between simple-substance nickel and trivalent nickel is 85:15 to 99:1, optionally 90:10 to 99:1, and further optionally 95:5 to 99:1.

In this way, this application in-situ reduces the nickel oxide hole transport layer by use of the reductive gas to reduce the charged nickel on the surface of the hole transport layer to simple-substance nickel. The gas used for in-situ reducing the surface of the nickel oxide hole transport layer further contains a carrier gas. The introduced carrier gas ensures removal of the generated water vapor when ensuring smooth progress of the experiment. In addition, the used carrier gas and reductive gas are passed into the airtight device at one time, thereby effectively ensuring that the surface of the nickel oxide hole transport layer is uniformly reduced.

In this embodiment of this application, in step S1, the transparent conductive glass substrate needs to be cleaned before use, for example, ultrasonically cleaned with deionized water, acetone, isopropanol, or the like.

In some embodiments, in step S2, the methods for preparing a hole transport layer include, but are not limited to, a sol-gel method, a sputtering method, a process of spin-coating with nickel oxide nanoparticles, and the like.

In some embodiments, in step S2, a process of preparing a hole transport layer by a sol-gel method includes the following steps: dripping a solution of a nickel-containing substance, optionally in an amount of 0.01 to 1 mL, onto a transparent conductive glass substrate, and then rotating the substrate together with the solution at a rotation speed of optionally 1000 to 8000 rpm for a rotation duration of optionally 10 to 60 seconds, and then performing an annealing process. Optionally, the annealing process is: keeping the substrate together with the solution under 80° C. for 1 to 100 minutes, and then raising the temperature to 200° C. to 500° C. within 10 to 50 minutes; and keeping the temperature of 200° C. to 500° C. for 0.1 to 5 hours, and then cooling down to below 100° C. to obtain the hole transport layer.

In some embodiments, in step S2, the hole transport layer is prepared by spray pyrolysis. A spray pyrolysis process includes the following operations: dissolving the nickel-containing substance in a solvent to obtain a solution of the nickel-containing substance; stirring, filtering, and taking the supernatant, making the supernatant into a spray liquid; spraying the spray liquid onto the surface of conductive glass, and then sintering the glass under a temperature of 100° C. to 500° C., and optionally 300° C. to 400° C., for a sintering duration of 10 to 120 minutes, and optionally 60 to 80 minutes; and then cooling down to obtain the hole transport layer.

In some embodiments, in step S2, the hole transport layer is prepared by magnetron sputtering. In the magnetron sputtering process, oxygen and argon are used at a volume ratio of 1:20 to 1:5, and optionally, 1:12 to 1:8 between oxygen and argon.

In some embodiments, the nickel-containing substance is selected from nickel oxide, nickel nitrate, nickel acetate, nickel acetylacetonate, or a mixture thereof.

Optionally, the nickel oxide is nickel oxide nanoparticles.

The nickel nitrate may be hydrated nickel nitrate such as nickel nitrate hexahydrate.

Optionally, the nickel acetate is hydrated nickel acetate, such as nickel acetate tetrahydrate.

A solvent for preparing a nickel-containing solution is one or more selected from methanol, ethylenediamine, or water.

In some embodiments, in step S3, the reductive gas is at least one selected from hydrogen, carbon monoxide, hydrogen sulfide, sulfur dioxide, hydrogen iodide, or ammonia.

In some embodiments, in the step S3, the carrier gas is at least one selected from nitrogen or argon.

In some embodiments, in step S3, a ratio between the carrier gas and the reductive gas is 99:1 to 70:30.

When the ratio between the carrier gas and the reductive gas falls within the specified range, the reduction effect for the surface of the nickel oxide hole transport layer can be further improved. If the concentration of the reductive gas is excessively high, an excessively thick layer of the nickel oxide hole transport layer will be reduced, thereby being adverse to the transport of holes and more dangerous. If the concentration of the reductive gas is excessively low, the time required for the reaction will be excessively long. Considering both efficiency and safe reaction, the ratio between the carrier gas and the reductive gas is optionally 90:10 to 80:20.

In some embodiments, in step S3, a duration of the reaction is 10 to 60 minutes. Considering both the optical-to-electrical conversion efficiency and cost together, the duration of the reaction is optionally 20 to 30 minutes.

In some embodiments, in step S3, a temperature of the reaction is 150° C. to 250° C., and optionally, 180° C. to 220° C.

In this embodiment of this application, in step S4, the perovskite light-absorbing layer is prepared using a conventional technique in this field. For example, the perovskite light-absorbing layer may be prepared by the following method: preparing a perovskite precursor solution; applying, by means of spin-coating, the perovskite precursor solution onto the hole transport layer treated in step S3, where the spin-coating speed is 1000 is 5000 rpm and the spin-coating duration may be 10 to 60 seconds; and annealing the coated hole transport layer under a temperature of 80° C. to 200° C. for 10 to 120 minutes to obtain a perovskite light-absorbing layer. An exemplary method for preparing the perovskite precursor solution is: Dissolving a perovskite precursor material (for example, at least one of formamidine iodide, lead iodide, methylammonium bromide, methylammonium iodide, cesium iodide, or lead bromide) in a solvent such as dimethylformamide (DMF) or dimethyl sulfoxide (DMSO); stirring well, and filtering the solution to obtain a supernatant.

In this embodiment of this application, in step S5, the electron transport layer is prepared using a conventional technique in this field. For example, the electron transport layer may be prepared by a spin coating method, an evaporation method, or the like.

In this embodiment of this application, in step S6, the electrode may be prepared by a conventional method in this field. For example, the electrode may be prepared by evaporation.

EMBODIMENTS

The following describes some embodiments of this application. The embodiments described below are illustrative, and are merely intended to construe this application but not to limit this application. Unless techniques or conditions are expressly specified in an embodiment hereof, the techniques or conditions described in the literature in this field or in an instruction manual of the product are applicable in the embodiment. A reagent or instrument used herein without specifying a manufacturer is a conventional product that is commercially available in the market.

Embodiment 1

S1: Taking a piece of indium tin oxide (ITO) coated glass of 2.0 cm×2.0 cm in size (glass 1.1 mm thick, ITO 100 nm thick); removing 0.35 cm of ITO from each of two opposite ends by laser etching to expose the glass substrate; ultrasonically cleaning the etched ITO conductive glass once by using water, acetone, and isopropanol successively; and drying the solvent of the ultrasonically cleaned ITO conductive glass by using a nitrogen spray gun, and then putting the ITO conductive glass into an ultraviolet ozone cleaner for further cleaning.

S2: Spin-coating the UV-ozone-treated ITO conductive glass with a nickel oxide nanoparticle aqueous solution (the concentration of the nanoparticles is 10 mg/mL, and the particle diameter is 10 nm) at a speed of 4000 rpm; and annealing the ITO conductive glass on a 100° C. hotplate for 30 minutes to obtain a hole transport layer that is 30 nm thick.

S3: Placing the ITO conductive glass with the hole transport layer onto the hotplate in an airtight glovebox; passing a carrier gas argon and a reductive gas hydrogen at a ratio of 98:2 into the glovebox, keeping the temperature of the hotplate at 200° C., and controlling the reaction time to be 30 minutes; placing the glass sheet into a vacuum drier after completion of the reaction, and vacuumizing and inflating the drier reciprocally to remove possible hydrogen that may remain on the surface of the glass sheet.

S4: Spin-coating the hole transport layer treated in step S3 with the perovskite precursor solution at a speed of 3000 rpm, where the perovskite precursor solution is prepared by dissolving 80 mg of formamidine iodide (FAI), 223 mg of lead iodide ($PbI_2$), and 15 mg of methylammonium chloride (MACl) in 1 mL of organic solvent, and the ingredients of the organic solvent are mixed at a ratio of 4:1 between DMF and DMSO; annealing the hole transport layer at 100° C. for 30 minutes; and cooling down to a room temperature to obtain an FA-based perovskite light-absorbing layer that is 550 nm thick.

S5: Spin-coating the prepared perovskite light-absorbing layer with a $PC_{61}BM$ chlorobenzene solution (concentration: 20 mg/mL) at a speed of 2000 rpm; annealing the perovskite light-absorbing layer at 100° C. for 10 minutes to obtain an electron transport layer that is 80 nm thick; and then spin-coating the perovskite light-absorbing layer with a bathocuproine (BCP)-containing isopropanol solution (the concentration of the BCP is 0.5 mg/mL) at a speed of 5000 rpm to obtain a passivation layer that is 8 nm thick.

S6: Evaporating and depositing an 80 nm-thick Ag sheet on the BCP passivation layer at a speed of 0.1 Å/s in an evaporation coater under a vacuum degree of $1\times10^{-5}$ Pa to obtain an electrode.

Upon completion of the above steps, the perovskite solar battery disclosed in this application is obtained.

Embodiments 2 to 5

The perovskite solar battery is prepared with reference to Embodiment 1 except that in step S3, the duration of reaction is 10 minutes, 20 minutes, 40 minutes, and 60 minutes respectively.

Embodiments 6 to 7

The perovskite solar battery is prepared with reference to Embodiment 1 except that in step S3, the carrier gas and the reductive gas are nitrogen in combination with carbon monoxide and nitrogen in combination with ammonia respectively.

Embodiments 8 to 11

The perovskite solar battery is prepared with reference to Embodiment 1 except that in step S3, the ratio between the carrier gas and the reductive gas is 99:1, 90:10, 80:20, and 70:30 respectively.

Embodiments 12 to 15

The perovskite solar battery is prepared with reference to Embodiment 1 except that in step S3, the temperature of the hotplate is held at 150° C., 180° C., 220° C., and 250° C. respectively.

Comparative Embodiment 1

The perovskite solar battery is prepared with reference to Embodiment 1 except that step S3 is omitted.

Comparative Embodiment 2

The perovskite solar battery is prepared with reference to Embodiment 1 except that in step S3, the duration of reaction is 5 minutes.

Comparative Embodiment 3

The perovskite solar battery is prepared with reference to Embodiment 1 except that step S3 is omitted and a commonly used passivation layer is added between the hole transport layer and the perovskite light-absorbing layer. The passivation layer employs poly[bis(4-phenyl)(2,4,6-trimethylphenyl)amine] (PTAA) and is 2 nm thick.

Performance Test

1. Measuring the molar ratio between simple-substance nickel and trivalent nickel on the surface of the hole transport layer Measuring the molar ratio between simple-substance nickel and trivalent nickel on the surface of the hole transport layer by means of XPS.

2. Measuring the optical-to-electrical conversion efficiency

The optical-to-electrical conversion efficiency test is carried out according to the national standard IEC61215 under an illuminated condition by using a digital source meter. The light source is provided by a solar simulator, and the light emitted by the light source conforms to the solar irradiation standard spectrum (AM 1.5G).

3. Testing the stability

Continuously estimating the optical-to-electrical conversion efficiency of the battery, and using the optical-to-electrical conversion efficiency of the $3^{rd}$ day and the $30^{th}$ day as a short-term efficiency and a long-term efficiency of the battery respectively.

Testing the perovskite solar batteries obtained in the foregoing embodiments and comparative embodiments separately according to the foregoing process. The specific parameter values are shown in Table 1.

TABLE 1

Performance test results of Embodiments 1 to 15 and Comparative Embodiments 1 to 3

| Serial number | Reduction condition | | | | | Molar ratio between simple-substance nickel and trivalent nickel on surface of reduced hole transport layer | Optical-to-electrical conversion efficiency (%) | |
|---|---|---|---|---|---|---|---|---|
| | Carrier gas | Reductive gas | Carrier gas:reductive gas | Duration of reaction (min) | Temperature of reaction (° C.) | | 3 days | 30 days |
| Embodiment 1 | Argon | Hydrogen | 98:2 | 30 | 200 | 90:10 | 19.01 | 19.02 |
| Embodiment 2 | Argon | Hydrogen | 98:2 | 10 | 200 | 85:15 | 18.91 | 18.83 |
| Embodiment 3 | Argon | Hydrogen | 98:2 | 20 | 200 | 87:13 | 18.92 | 18.99 |
| Embodiment 4 | Argon | Hydrogen | 98:2 | 40 | 200 | 92:8 | 19.02 | 19.03 |
| Embodiment 5 | Argon | Hydrogen | 98:2 | 60 | 200 | 94:6 | 19.23 | 19.27 |
| Embodiment 6 | Nitrogen | Carbon monoxide | 98:2 | 30 | 200 | 91:9 | 19.00 | 19.03 |
| Embodiment 7 | Nitrogen | Ammonia | 98:2 | 30 | 200 | 85:15 | 18.88 | 18.73 |
| Embodiment 8 | Argon | Hydrogen | 99:1 | 30 | 200 | 86:14 | 18.92 | 18.83 |
| Embodiment 9 | Argon | Hydrogen | 90:10 | 30 | 200 | 95:5 | 19.75 | 19.81 |
| Embodiment 10 | Argon | Hydrogen | 80:20 | 30 | 200 | 97:3 | 19.91 | 19.99 |
| Embodiment 11 | Argon | Hydrogen | 70:30 | 30 | 200 | 99:1 | 19.91 | 19.95 |
| Embodiment 12 | Argon | Hydrogen | 98:2 | 30 | 150 | 85:15 | 18.95 | 19.01 |
| Embodiment 13 | Argon | Hydrogen | 98:2 | 30 | 180 | 87:13 | 19.03 | 19.07 |
| Embodiment 14 | Argon | Hydrogen | 98:2 | 30 | 220 | 93:7 | 19.11 | 19.15 |
| Embodiment 15 | Argon | Hydrogen | 98:2 | 30 | 250 | 94:6 | 19.22 | 19.25 |
| Comparative Embodiment 1 | / | / | / | / | / | 0 | 18.32 | 15.53 |
| Comparative Embodiment 2 | Argon | Hydrogen | 98:2 | 5 | 200 | 80:20 | 18.82 | 18.51 |
| Comparative Embodiment 3 | / | / | / | / | / | / | 19.01 | 18.55 |

In contrast to Comparative Embodiments 1 to 2, all the perovskite solar batteries prepared in Embodiments 1 to 15 achieve a relatively high optical-to-electrical conversion efficiency and exhibit high stability in a 30-day period. Therefore, reducing the contact surface of the nickel oxide hole transport layer in contact with the perovskite light-absorbing layer and causing the ratio between the simple-substance nickel and the trivalent nickel on the surface to fall within 85:15 to 99:1 can improve the long-term stability of the perovskite solar battery.

In Embodiments 1 to 15, the nickel oxide hole transport layer is reduced; and, in Comparative Embodiments 3, the hole transport layer is passivated in a conventional manner according to the prior art. Evidently, compared with conventional solar battery, the perovskite solar battery prepared by reducing the nickel oxide hole transport layer significantly improves the long-term stability by a simple and efficient method, thereby saving time cost and material cost.

It is hereby noted that this application is not limited to the foregoing embodiments. The foregoing embodiments are merely examples. Any and all embodiments with substantively the same constituents or exerting the same effects as the technical ideas hereof without departing from the scope of the technical solutions of this application still fall within the technical scope of this application. In addition, all kinds of variations of the embodiments conceivable by a person skilled in the art and any other embodiments derived by combining some constituents of the embodiments hereof without departing from the subject-matter of this application still fall within the scope of this application.

What is claimed is:

1. A perovskite solar battery, comprising a transparent conductive glass substrate, a hole transport layer, a perovskite light-absorbing layer, an electron transport layer, and an electrode, wherein the hole transport layer is a nickel oxide hole transport layer; simple- substance nickel and trivalent nickel exists on a contact surface of the hole transport layer in contact with the perovskite light-absorbing layer; and, on the contact surface of the hole transport layer in contact with the perovskite light-absorbing layer, a ratio between simple- substance nickel and trivalent nickel is 85:15 to 99:1.

2. The perovskite solar battery according to claim 1, wherein no interface passivation material, exists on the contact surface of the hole transport layer in contact with the perovskite light-absorbing layer.

3. The perovskite solar battery according to claim 1, wherein the perovskite solar battery is an inverted perovskite solar battery.

4. The perovskite solar battery according to claim 1, wherein a ratio between simple-substance nickel and trivalent nickel is 90:10 to 99:1.

5. The perovskite solar battery according to claim 1, wherein a ratio between simple-substance nickel and trivalent nickel is 95:5 to 99:1.

6. A method for preparing a perovskite solar battery, comprising the following steps:
   S1: providing a transparent conductive glass substrate;
   S2: preparing a hole transport layer on the transparent conductive glass substrate;
   S3: placing, in an airtight device, the transparent conductive glass substrate on which the hole transport layer is prepared in step S2, and passing a carrier gas and a reductive gas into the airtight device to react;
   S4: preparing a perovskite light-absorbing layer on the hole transport layer treated in step s3;
   S5: preparing an electron transport layer on the perovskite light-absorbing layer; and
   S6: preparing an electrode on the electron transport layer to obtain a perovskite solar battery, wherein
   the perovskite solar battery comprises a transparent conductive glass substrate, a hole transport layer, a perovskite light-absorbing layer, an electron transport layer, and an electrode;
   the hole transport layer is a nickel oxide hole transport layer; simple-substance nickel and trivalent nickel exist on a contact surface of the hole transport layer in contact with the perovskite light-absorbing layer; and, on the contact surface of the hole transport layer in contact with the perovskite light-absorbing layer, a ratio between simple-substance nickel and trivalent nickel is 85:15 to 99:1.

7. The method according to claim 6, wherein, in step S3, the reductive gas is at least one selected from hydrogen, carbon monoxide, hydrogen sulfide, sulfur dioxide, hydrogen iodide, or ammonia.

8. The method according to claim 6, wherein, in the step S3, the carrier gas is at least one selected from nitrogen or argon.

9. The method according to claim 6, wherein, in step S3, a ratio between the carrier gas and the reductive gas is 99:1 to 70:30.

10. The method according to claim 6, wherein, in step S3, a duration of the reaction is 10 to 60 minutes.

11. The method according to claim 6, wherein, in step S3, a temperature of the reaction is 150° C. to 250° C.

12. The method according to claim 6, wherein a ratio between simple-substance nickel and trivalent nickel is 90:10 to 99:1.

13. The method according to claim 6, wherein a ratio between simple-substance nickel and trivalent nickel is 95:5 to 99:1.

* * * * *